(12) United States Patent
Szajnowski (10) Patent No.: US 7,123,547 B2
(45) Date of Patent: Oct. 17, 2006

(54) TIME DELAY MEASUREMENT (75) Inventor: Wieslaw Jerzy Szajnowski, Surrey (GB)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 294 days.

(21) Appl. No.: 10/809,339

(22) Filed: Mar. 26, 2004

(65) Prior Publication Data
US 2004/0233785 A1   Nov. 25, 2004

(30) Foreign Application Priority Data
Apr. 3, 2003   (EP) ................... 03252132

(51) Int. Cl.
*G01S 13/10* (2006.01)
*G01S 3/80* (2006.01)
(52) U.S. Cl. .......................... 367/124; 367/98
(58) Field of Classification Search .................. 367/98, 367/125, 127; 342/127, 442, 91
See application file for complete search history.

(56) References Cited
U.S. PATENT DOCUMENTS
4,972,441 A  *  11/1990  Roberts et al. ............. 375/342

6,115,113 A    9/2000  Flockencier

FOREIGN PATENT DOCUMENTS
WO    WO 00/39643 A1   7/2000

* cited by examiner

*Primary Examiner*—Dan Pihulic
(74) *Attorney, Agent, or Firm*—Birch, Stewart, Kolasch & Birch, LLP

(57) ABSTRACT

A time measurement system for measuring the delay between first and second signals comprises means for detecting the times of upcrossings when the first signal crosses a predetermined level (preferably substantially different from the average level) with a positive slope and the times of downcrossings when the first signal crosses the predetermined level with a negative slope. These events are transmitted to a remote device receiving the second signal, which uses the events to define respective staggered segments of the second signal, to sum said segments and to detect a predetermined feature in said sum, the position of said feature representing the delay between the first and second signals.

11 Claims, 6 Drawing Sheets

TIME DELAY MEASUREMENT

FIELD OF THE INVENTION

This invention relates to a method and apparatus for determining the relative time delays between a plurality of signals, particularly but not exclusively wideband acoustic signals.

BACKGROUND OF THE INVENTION

One obvious application of time delay determination is the synchronisation of different processes or functions being performed in a complicated engineering system, especially a communication system. There are many other practical applications of time delay determination; for example, radar and sonar systems. Also, in some industrial and biomedical applications, where a distance is known, but the velocity of a waveform, associated with some phenomenon or process, is required, this can be estimated by determining the time required for this phenomenon or process to travel the known distance.

One conventional method of determining a time delay $\Delta t$ between two signals x(t) and y(t) is to estimate the standard cross-correlation function $$R_{xy}(\tau)=(1/T)\int x(t).y(t+\tau)dt=(1/T)\int x(t-\tau).y(t)dt$$

where the integral is evaluated over the observation interval of duration T and for a range of hypothesised time delays $\tau_{min}<\tau<\tau_{max}$. The value of argument $\tau$, say $\tau_0$, that maximises the cross-correlation function $R_{xy}(\tau)$ provides an estimate of the unknown time delay $\Delta t$.

In general, the operation of cross-correlation comprises the following three steps:
1. delaying the reference signal x(t) by $\tau$;
2. multiplying the values of a received signal y(t) and delayed reference x(t);
3. integrating the product obtained in step 2 over a specified observation time interval T.

Figure 1:
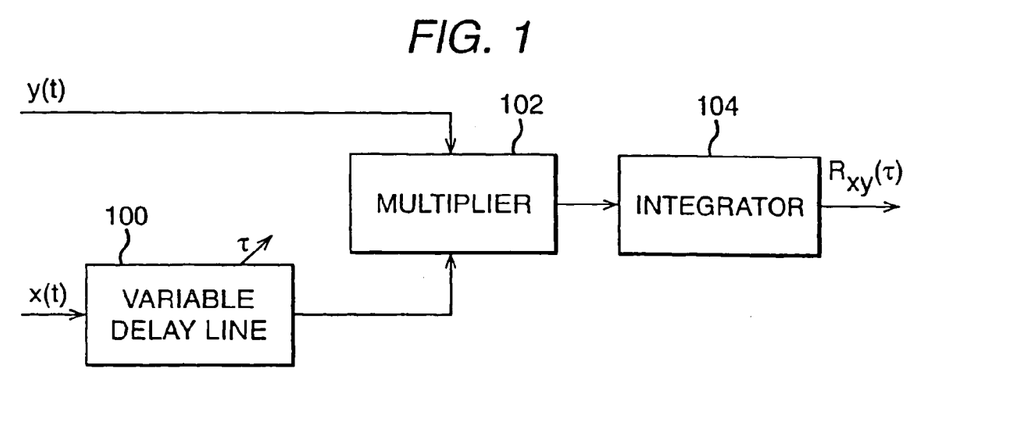
FIG. 1 is a block diagram of a standard cross-correlator system.
Figure 2:
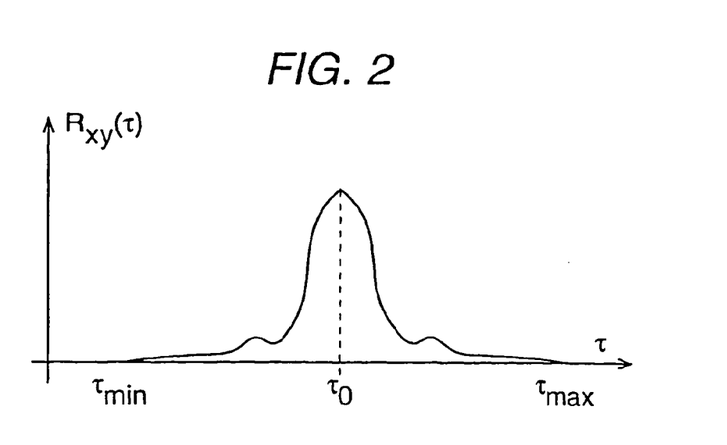
FIG. 2 shows an example of a cross-correlation curve.

A block diagram of a standard cross-correlator system is presented in FIG. 1. The system comprises a variable delay line 100, a multiplier 102 and an integrator 104. An example of a cross-correlation curve, with its maximum determining the time delay estimate $\tau_0$, is shown in FIG. 2.

WO-A-00/39643 discloses an improved technique for the calculation of the time delay between signals using a technique referred to herein as "crosslation". The contents of WO-A-00/39643 are incorporated herein by reference.

The term "crosslation" as used herein refers to a technique whereby predefined (preferably at least substantially aperiodic) events which occur in one signal are used to define staggered segments of a second signal, and representations of the staggered segments are then combined. The first and second signals may in fact be the same signal, in which case the resulting combined representation will provide information regarding the statistical properties of that signal, and in particular about the average behaviour of the signal before and after the predefined events. Alternatively, the first and second signals may be different signals ("mutual crosslation"), or one may be a delayed version of the other, in which case the combined representation will provide information about the relationship between those signals. For example, if the combined representation contains a feature which would be expected from combining segments associated with multiple predefined events, this may indicate that one of the signals is delayed with respect to the other by an amount corresponding to the position within the representation of that feature.

According to WO-A-00/39643, a binary, bipolar signal is subjected to an unknown delay. The non-delayed version of the signal is examined to determine when its level crosses zero with a positive slope (an upcrossing). The timing of these crossing events is used to obtain respective segments of the delayed signal, the segments having a predetermined duration. The segments are all summed, and a representation of the summed segments is then examined to locate a feature in the form of an odd function. The position within the representation of a zero-crossing in the centre of the odd function represents the amount by which the signal has been delayed. Instead of using upcrossings, the non-delayed version of the signal could be examined to determine when its level crosses zero with a negative slope (downcrossings).

WO-A-00/39643 also suggests improving accuracy by using both upcrossings and downcrossings. In this case, the segments defined by the downcrossings are subtracted from the segments defined by the upcrossings to obtain the odd function which is then examined.

The crosslation techniques of WO-A-00/39643 are particularly suited for object tracking with the use of active sensors, such as radar or active sonar, in which the surveillance region of interest is illuminated by an interrogating energy waveform to obtain object-backscattered returns. In such circumstances suitable (e.g., binary) signals can be chosen for modulating the transmitted signal. However, the technique can be less advantageous in applications involving passive sensors which capture only object-generated signals (or object-influenced signals from separate sources), for example systems for detecting, localising and tracking the movement of people, wheeled or tracked vehicles, speedboats or vibrating machinery, etc. using wideband acoustic signals generated thereby. It would also be desirable to provide a system which generates an output which is better suited for some applications than the odd function generated by the system of WO-A-00/39643 (e.g. applications which are primarily intended for object detection, rather than tracking of an already-detected object).

Object-generated acoustic signals are classified as wideband signals since the ratio of their highest frequency component to lowest frequency component is relatively large. For example, for the audio range, 30 Hz to 15 kHz, the ratio is 500. In a case of wheeled and tracked vehicles, dominant frequency components may range from about 20 Hz to 2 kHz, resulting in a ratio of 100.

Not only do acoustic signals emitted by objects of interest occupy a wide frequency range, but they also will manifest a non-stationary and chaotic nature with identifiable intermittent transients. As a result, many known cross-correlation techniques based, explicitly or implicitly, on the assumptions of signal stationarity and noise Gaussianity are only of limited practical use. Furthermore, most practical implementations have to deal with discrete-time samples, so that the optimisation procedures and performance analyses carried out in the continuous-time framework cannot be fully applicable.

A specific example of an application in which improved techniques for object detection and localisation would be desirable is that of security surveillance with a network of distributed acoustic sensors forming an 'acoustic fence'. When an object of interest, such as a vehicle, has been detected and localised, the estimated object position can be utilized by security cameras for aiming and zooming in order to enhance the quality of recorded images. Such systems may be installed for monitoring purposes in industrial environments, e.g. to track moving objects, or to offer improved continuous surveillance of critical infrastructure, including power grids, power plants, gas and oil pipelines and water systems. Another application is that of coastguard or littoral surveillance in which speedboats and other surface vessels of interest can be detected and localised by a network of floating buoys employing acoustic sensors and low-power radio transceivers providing an intersensor communication link.

In addition to the above surveillance and reconnaissance applications, it would also be desirable to improve multimedia applications involving distributed microphone networks which are capable of enhancing audio signals for improved intelligibility, and cuing for camera aiming.

Accordingly, it would be desirable to provide an improved technique for time delay measurement, for example for use in object detection systems, including object locating and object tracking systems.

SUMMARY OF THE INVENTION

Aspects of the present invention are set out in the accompanying claims.

According to a further aspect of the invention, one signal is analysed to determine the times at which a predetermined level, which is preferably substantially different from the average signal level, is crossed, so as to generate event data, for example in the form of an event stream. This data is used to segment a second signal, and the derived signal segments, corresponding to both the upcrossing events and the downcrossing events in the first signal, are summed. The resultant waveform exhibits a substantially unipolar shape (as distinct from the odd function produced by the system of WO-A-00/39643) from which a position in time corresponding to the delay between the two signals can be readily determined. Various techniques could be used to find this position, such as locating the centre of gravity of the shape, or the median value (corresponding to the location at which the area of the shape is divided equally into two). In the preferred embodiment, the position is found by locating a peak of the resultant waveform, the peak having a position corresponding to the delay between the two signals and an amplitude representing the reliability of the delay measurement.

For best operation, both signals are preferably of a wideband, noise-like, random or chaotic nature, and the crossings of the predetermined level by the first signal should occur at, at least substantially aperiodic, and preferably random, intervals. The first signal may be an object-generated signal received at a first location, and the second an object-generated signal received at a second location. Alternatively, the first signal may correspond to a transmitted interrogating signal, and the second may be a reflection of the interrogating signal from an object. In either case, a wireless communication link may be used to transmit the event data to the site at which the second signal is processed.

Arrangements embodying the invention will now be described by way of example with reference to the accompanying drawings.

DESCRIPTION OF THE DRAWINGS

FIGS. 4(a) and (b) illustrate schematically the process of forming a mutual crosslation sum waveform in a slave device of the embodiments of FIGS. 3(a) and 3(b) by averaging overlapped segments of a captured signal at the significant instants supplied by a master device;

FIGS. 7(a) and (b) illustrate waveforms derived in respective modifications of the embodiment of FIG. 3(a).

DETAILED DESCRIPTION OF PREFERRED EMBODIMENTS

Figure 3:
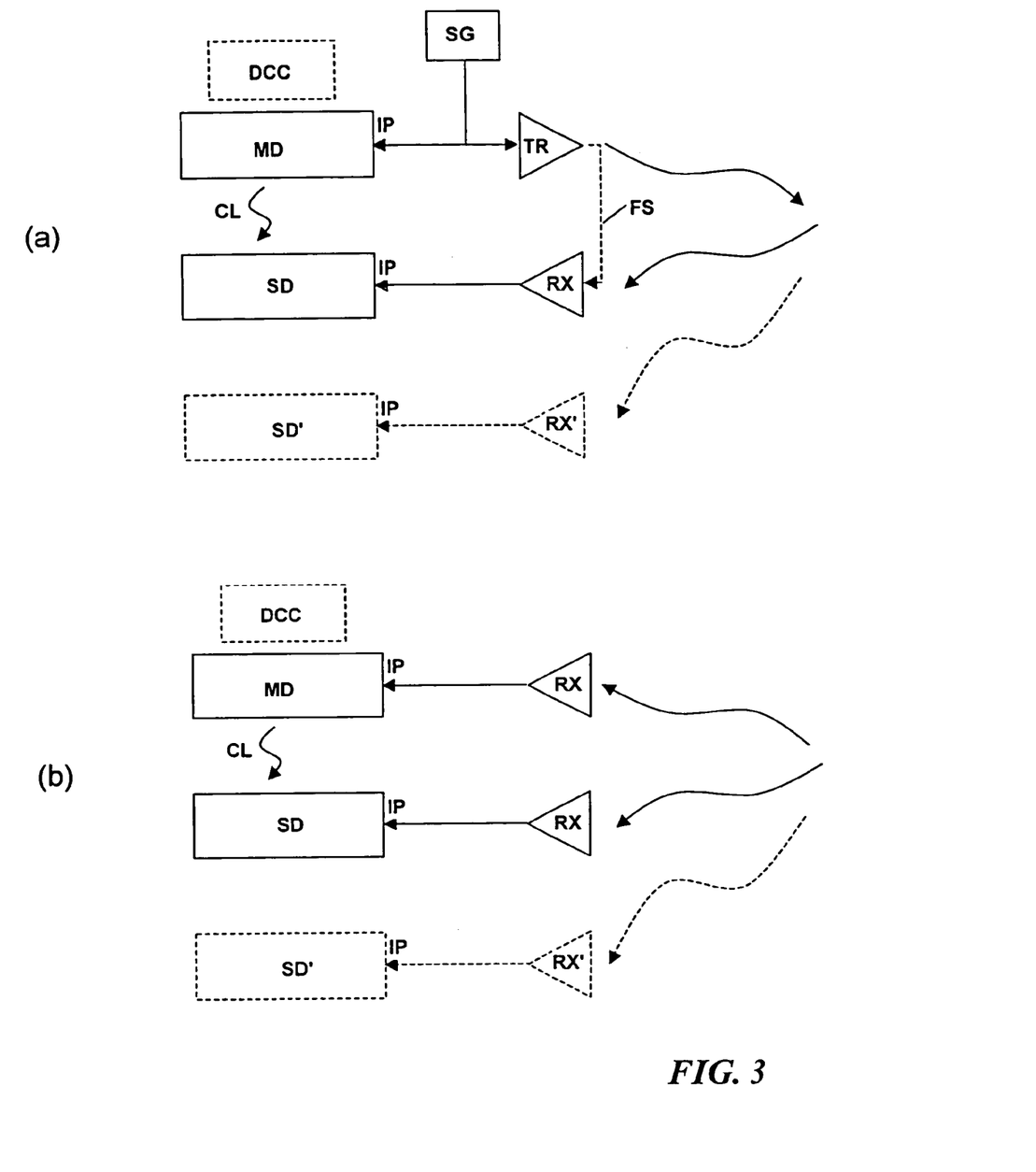
FIGS. 3(a) and 3(b) show respective embodiments of object detection and location systems according to the present invention.

FIG. 3(a) is a block diagram of a first embodiment of the invention, which is an active object detection system arranged to transmit a signal and to detect an object and determine its range by determining the delay between that signal and a received signal which has been reflected from the object. The particular embodiment shown is an active acoustic system which transmits and receives acoustic signals; the system may be an active bi-static system, or, as explained below, an active multi-static system.

A signal generator SG generates an electrical signal which is transmitted, following suitable modulation, by a transmitter TR and received by a receiver RX. The signal is also delivered to an input IP of a main, or master, device MD. The received signal is delivered to the input IP of a subsidiary, or slave, device SD. In addition, the master device MD sends data to the slave device SD over a communications link schematically illustrated as CL. This may be a wired link, particularly if the master device and slave device are located in proximity to each other. However, the present invention is particularly advantageous in systems in which the master device and slave device are located remote from each other at different sites, in which case the communications link CL may be a bandwidth-limited channel, such as a wireless link.

As explained below, in response to the received signal appearing at its input IP, and the data received from the master device MD, the slave device SD can calculate the delay between the transmitted and received signals thereby to determine the distance travelled by the received signal.

The system may have additional slave devices, one of which is shown at SD', coupled to additional receivers RX', to form a multi-static system. The slave devices SD' also receive the data from the master device MD and thus enable different delay calculations to be performed by the respective slave devices. Where multiple slave devices are provided, each can be arranged to send the delay calculated thereby to a common data collection centre DCC.

The delay calculated by the or each slave device can be used, if desired with other measurements, for a variety of purposes, including detection of the range, bearing and/or localisation of objects. For example, the data collection centre DCC could perform the calculations required for object localisation and tracking.

FIG. 3(b) shows an alternative embodiment, which is similar to that of FIG. 3(a), except that this embodiment, rather than being an active system, relies on passive sensors responsive to object-generated signals. Thus, the signal generator SG is omitted, and the input of the master device MD is coupled to an additional receiver RX. The slave device SD calculates a delay of its received signal relative to the delay of the signal received by the master device MD. Again, multiple slave devices SD' and a data collection centre DCC may be provided.

In both embodiments, the master device MD performs the following operations:

1. Detecting the time instants at which its input signal crosses a predetermined level L, and then forming a sequence of consecutive time intervals, defined by the instants of alternating upcrossing and downcrossings of level L. In the following, those specific instants will be referred to as significant instants. For proper operation of the system, the significant instants should occur at, at least substantially aperiodic, and preferably random, intervals. The characteristics of the signal generator SG of FIG. 3(a), or the type of object-generated signals in FIG. 3(b), should be selected accordingly, preferably such that the significant instants are derived from a wideband noise-like random or chaotic signal. Significant instants are supplied, via the communication link CL, to all slave devices SDs in order to enable them to perform time delay determination.
2. Determining the time instants that define the time intervals during which a predetermined number N of significant instants have been detected. Those time instants, referred to as end-of-cycle pulses EC are sent, via the communication link CL, to all slave devices SDs in order to synchronize their internal data update. The instants at which EC pulses occur may be viewed as a result of 'decimation' of significant instants.

In both embodiments a slave device SD performs the following operations:

1. Summing, at the significant instants supplied by the master device MD, overlapping segments of an input signal to determine a "crosslation sum" CS waveform, which is explained in more detail below.

This operation of crosslation will be referred to as mutual crosslation, since it is performed at significant instants extracted from a signal different from that being actually processed.

2. Transferring the crosslation sum CS waveform resulting from the summation to a waveform analyzer WAN (see FIG. 6) at the time instants coincident with the end-of-cycle EC pulses supplied by the master device MD. The waveform analyzer WAN determines both the maximum value of each received crosslation sum CS waveform and the position in time of this maximum. The position in time of the maximum in the crosslation sum CS waveform is a measure of the time difference of arrival between the master device MD and the slave device SD producing that crosslation sum CS waveform. The maximum value is an indication of the reliability of the time difference measurement.

Figure 4:
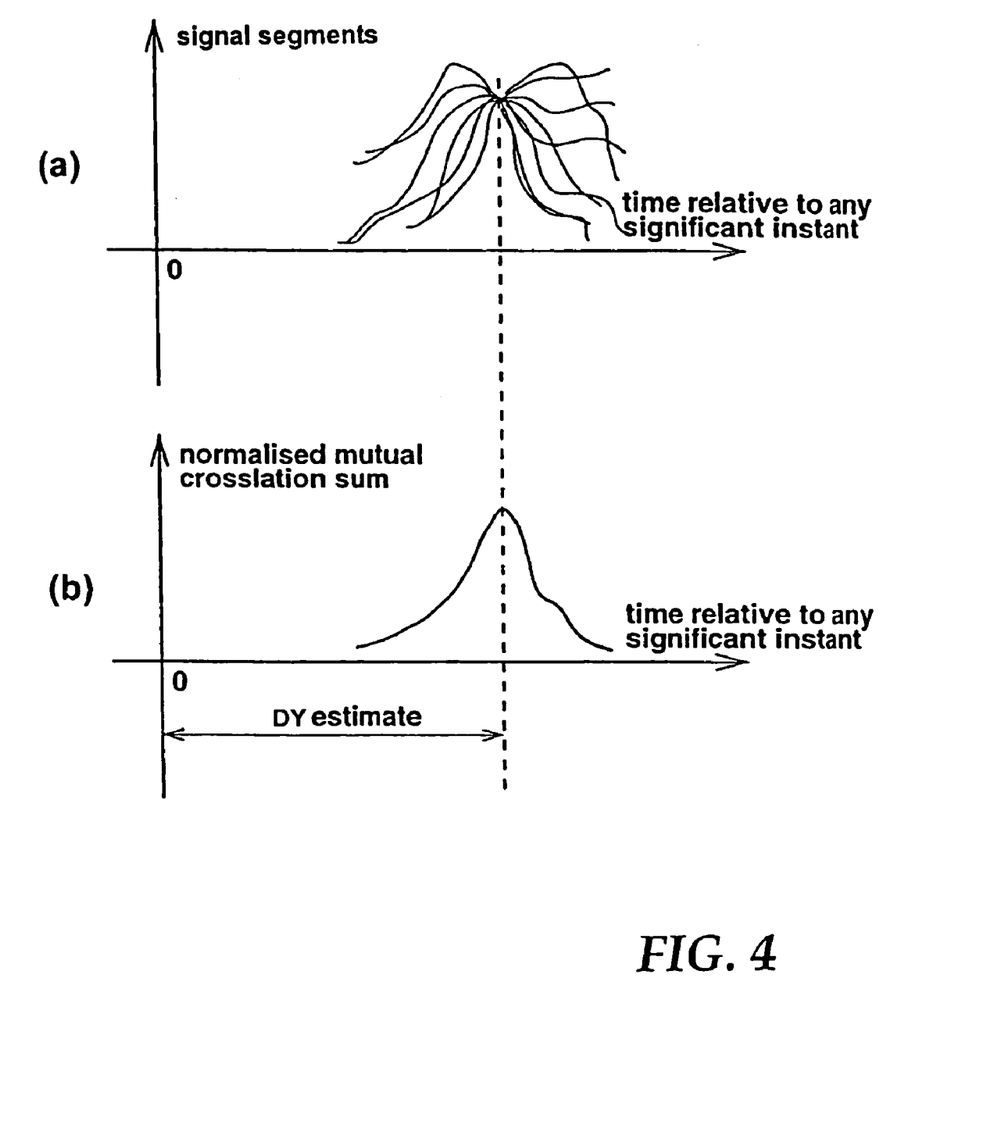

FIG. 4 illustrates schematically the process of forming the mutual crosslation sum CS waveform in a slave device SD by averaging overlapped segments of a captured signal at the significant instants supplied by a master device MD.

FIG. 4(a) shows the respective segments of the sensor output signal, the respective segments comprising samples taken over predetermined periods before and after respective crossings of a level L (upcrossings and downcrossings) sensed at the master sensor device. The segments are then combined. The resulting waveform is preferably then normalised by dividing the amplitude by the number of waveform segments summed. (This is of course equivalent to averaging the waveform segments; references herein to summing are intended to encompass averaging.) An example of a normalised crosslation sum is shown in FIG. 4(b). This will exhibit an amplitude peak at a particular time (on the horizontal axis) which is representative of the delay between the signals processed by the respective master and slave devices. (For some types of signals, the peak may not precisely coincide with the time delays, but the error is likely to be negligible.) The term "peak" is used herein to refer to both waveforms with local maxima and waveforms with local minima (i.e. "troughs"). For example, by selecting a negative value for level L, the normalised crosslation sum would be a peak having an extreme value which corresponds to a negative local minimum.

Thus, the maximum value of the crosslation sum CS waveform determined by a slave device SD is a measure of the level of this portion of the captured signal which is a time-shifted replica of the signal captured by the master device MD. This property follows from the summation by the slave device SD of the signal segments at the significant instants determined by the master device MD. Any other signal or noise, unrelated by a simple time shift to the primary signal from which the significant instants have been extracted, will have a pattern of level crossings substantially different from that formed by the significant instants.

Therefore, if the maximum of the crosslation sum CS waveform determined by that slave device SD becomes relatively small or negligible, then there is a possibility that the slave device SD is capturing also signals emitted by objects other than that represented by the signal from the master device MD.

Figure 5:
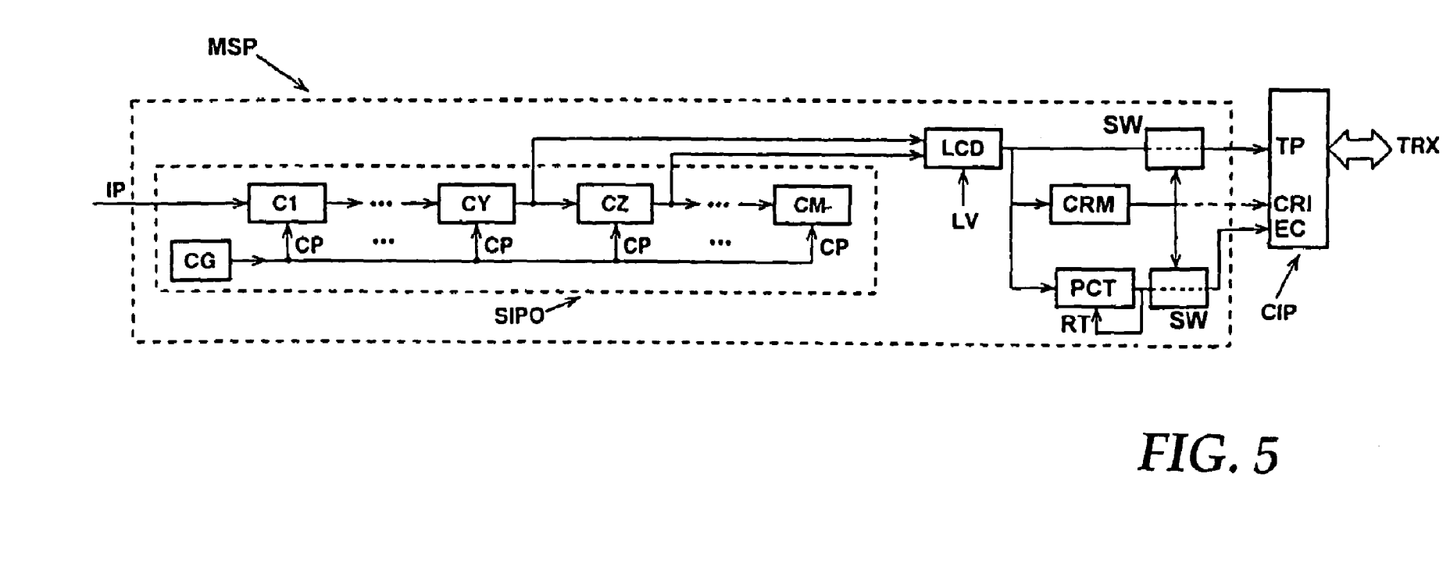
FIG. 5 is a more detailed block diagram of a master device of the embodiments of FIGS. 3(a) and 3(b)

FIG. 5 is a more detailed block diagram of the master device MD of FIGS. 3(a) and 3(b).

A master signal processor MSP comprises an analogue or digital serial-in-parallel-out shift register SIPO with a suitable clock generator CG, a level crossing detector LCD, a crossing rate monitor CRM and a pulse counter PCT and is coupled to a communications interface processor CIP.

The level crossing detector LCD detects both upcrossings and downcrossings of level L by a signal at input IP which is coupled to the input of the shift register SIPO.

The shift register SIPO comprises M storage cells, C1, C2, . . . , CM. Each cell has an input terminal, an output terminal and a clock terminal CP. The cells are connected serially so that each cell, except for the first one C1 and the last one CM, has its input terminal connected to the output terminal of a preceding cell and its output terminal connected to the input terminal of a succeeding cell. The input terminal of cell C1 is used as the serial input of the shift register SIPO. The output terminals of all M cells are regarded as the parallel output terminals of the shift register SIPO. All clock terminals CP of the cells are connected together to form the clock terminal of the shift register.

A sequence of suitable clock pulses is provided by the clock generator CG. When a clock pulse is applied to the clock terminal of the shift register, the signal sample stored in each cell is transferred to and stored by the succeeding cell. The shift register SIPO can be implemented either as a digital device or as a discrete-time analogue device, for example, in the form of a "bucket-brigade" charge-coupled device CCD.

When a crossing of a prescribed level L is detected by the level crossing detector LCD, a short trigger pulse TP is generated at the output of the level crossing detector LCD.

Trigger pulses TP define significant instants required by the slave devices SDs. Trigger pulses TP are applied to an input TP of the communication interface processor CIP, and then broadcast via a radio transceiver TRX of the communications link CL to the slave devices SDs to synchronise the process of mutual crosslation.

The trigger pulse TP also increments by one the current state of the pulse counter PCT. The capacity of the counter PCT is equal to a predetermined number N of level crossings.

The desired crossing level L is set by supplying a suitable threshold value to the input LV of the level crossing detector LCD, which has two inputs connected to the outputs of adjacent storage cells CY and CZ. If the number M of the shift register SIPO outputs is odd, then preferably one of the two selected outputs is the middle output, i.e. output M+½, of the shift register SIPO. However, if the number of shift register SIPO outputs is even, then the two selected outputs are preferably output M/2 and output M/2+1. The detection of the crossing of level L can be accomplished by applying the following decision rule:

If output of CY<L and output of CZ>L, or if output of CY>L and output of CZ<L, then a level upcrossing has occurred in a "virtual" cell VC positioned between cell CY and cell CZ; otherwise no level crossing has occurred.

From statistical considerations it follows that when the period of the clock generator is small compared to the time variability of a signal being processed, the 'time' location of the virtual cell VC is uniformly distributed over the clock period. Consequently, it is assumed that the virtual cell VC is 'located' in the middle between cell CY and cell CZ.

When a predetermined number N of level crossings has been detected by the level crossing detector LCD, and registered by the pulse counter PCT, an end-of-cycle EC pulse is produced at the output of the PCT. The EC pulse resets the PCT, via the reset input RT. End-of-cycle pulses EC are required by the slave devices SDs. EC pulses are applied to the input EC of the communication interface processor CIP, and then broadcast via the radio transceiver TRX of the communications link CL to the slave devices SDs in order to synchronize their internal data update.

The crossing rate monitor CRM receives the significant instants from the level crossing detector and provides an output representative of the rate at which the significant instants occur. Preferably, the crossing rate monitor CRM is a moving-average counter with a suitably selected 'time window'. The output of the crossing rate monitor CRM is delivered to two switching devices SW respectively arranged to prevent the trigger pulses TP and the end-of-cycle pulses EC being delivered to the communications interface processor CIP for onward transmission if the crossing rate is below a predetermined level (indicating that the master device of FIG. 5 is likely to be detecting only noise rather than an object-generated signal). (The crossing rate monitor CRM of FIG. 5 can be omitted in the FIG. 3(a) version, where the signal generator SG can guarantee well-defined significant instants.)

Figure 6:
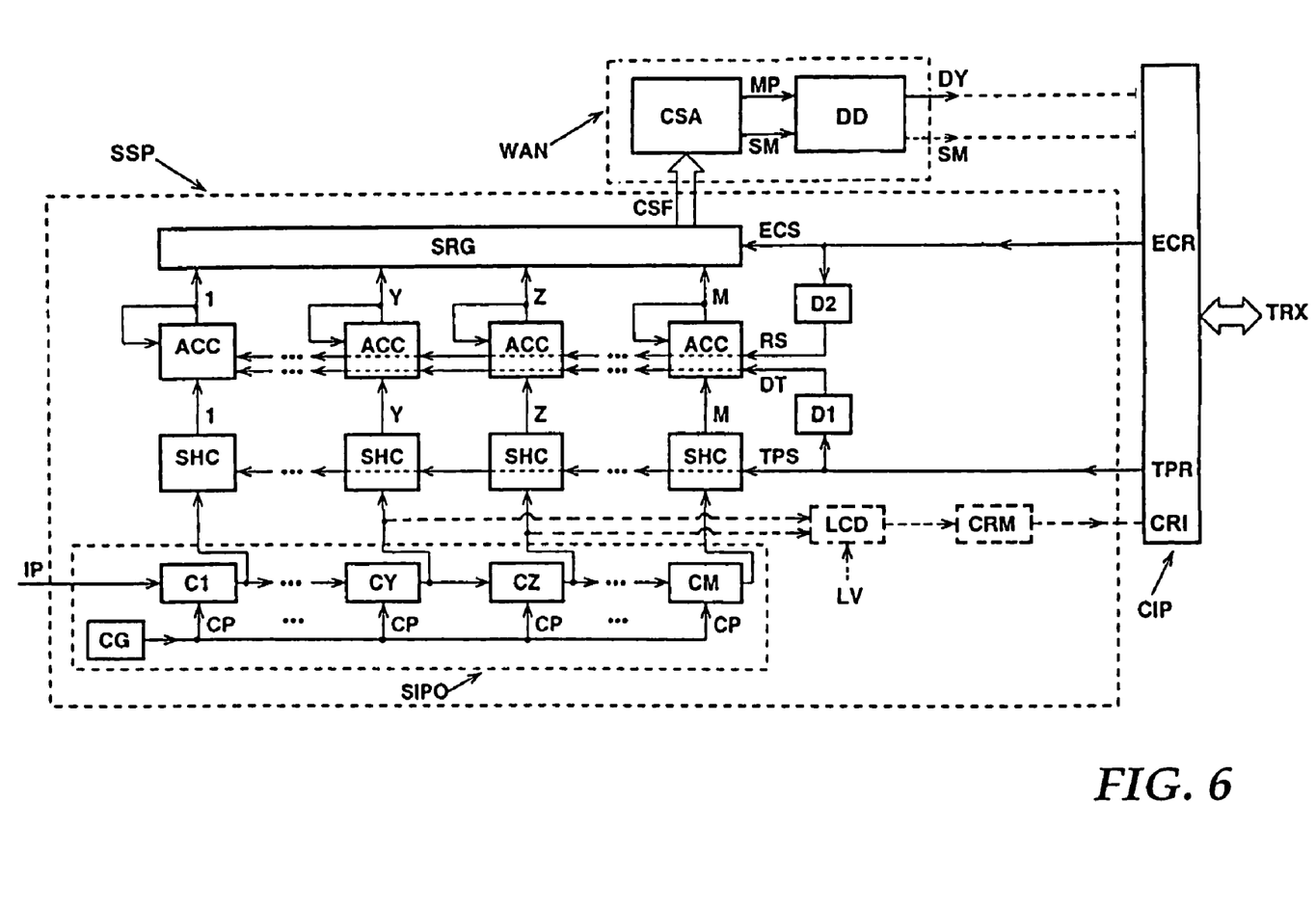
FIG. 6 is a more detailed block diagram of a slave device of the embodiments of FIGS. 3(a) and 3(b)

FIG. 6 is a more detailed block diagram of the slave device SD of FIGS. 3(a) and 3(b).

A slave signal processor SSP comprises an analogue or digital serial-in-parallel-out shift register SIPO with a suitable clock generator CG, two pulse delay circuits D1 and D2, a plurality of sample-and-hold circuits SHC, a plurality of accumulators ACC and a storage register SRG. The storage register SRG may also incorporate a suitable waveform interpolator. The slave signal processor SSP is coupled to a waveform analyzer WAN, incorporating a crosslation sum analyzer CSA, and to a communications interface processor CIP.

The shift register SIPO is arranged to process its input signal as in the master signal processor MSP of FIG. 5. The parallel outputs of the shift register SIPO are connected to M respective sample-and-hold circuits SHC.

Each significant instant, received from the master device MD via the TPR output of the communication interface processor CIP, initiates, via a common TPS input, the simultaneous operation of all sample-and-hold circuits SHC. Each sample-and-hold circuit SHC captures the instantaneous value of the signal appearing at its input and supplies this value to a respective accumulator ACC.

A delayed trigger pulse DT is obtained from the delay circuit D1 whose delay is preferably equal to the settling time of the sample-and-hold circuits SHC. The delayed pulse DT initiates, via a common input DT, the simultaneous operation of all accumulators ACC driven by respective sample-and-hold circuits SHC. The function of each accumulator ACC is to perform addition or averaging of all samples appearing successively at its input during one full operation cycle of the mutual crosslator system.

Each end-of-cycle pulse, received from master device MD at output ECR of communication interface processor CIP, initiates, via input ECS, the transfer of the accumulators' contents to the storage register SRG. Each ECR pulse, suitably delayed by the pulse delay circuit D2, sets all the accumulators ACC to their initial zero state via the common reset input RS. Shortly after the occurrence of the ECR pulse, a discrete-time version of the determined mutual crosslation sum waveform is available at the output CSF of the storage register SRG.

When no waveform interpolation is used in the SRG, the determined mutual crosslation sum waveform is represented by M values. However, some additional signal processing may be performed in the register SRG to produce an interpolated smoothed representation of the mutual crosslation sum waveform comprising more than M primary values supplied by the accumulators ACC.

The mutual crosslation sum waveform is transferred to the crosslation sum analyzer CSA of the waveform analyzer WAN.

The crosslation sum analyzer provides an output MP representing the position of the maximum in the crosslation sum waveform and an output SM which is the maximum value of the crosslation sum waveform. These are delivered to a decision device DD of the waveform analyzer WAN.

The decision device DD provides an output signal DY representative of the calculated delay, which is dependent upon the signal MP representing the position of the maximum in the crosslation sum waveform. However, it is inhibited from providing this output if the input signal SM representing the amplitude of the peak in the crosslation waveform is lower than a predetermined value (which indicates that the delay measurement is unreliable).

The output DY of the decision device DD may, as indicated by the broken line, be sent to the communication interface processor CIP for onward transmission. If desired, the value SM can also be transmitted (as indicated in broken lines), possibly instead of using the value to determine whether to inhibit calculation of distance DY. This may be particularly useful in arrangements incorporating a plurality of slave devices SD, in which case the value SM could be used as a weighting function to affect the influence of the respective delay value DY on a calculation involving multiple delay values DY.

It is important, particularly in the embodiment of FIG. 3(b), to distinguish between noise and object-dependent signals. Example 1 discusses in more detail the difference between crossing rates expected in noise-alone and signal-plus-noise cases.

EXAMPLE 1

Assume that $\delta_n$ is the rms value of background noise with a rectangular frequency spectrum extending from 0 Hz to 2 kHz. If background noise has a Gaussian distribution, then the expected crossing rate achieves its maximum of 2310 crossings per second for a crossing level L=0 i.e., the zero crossing rate. When the level L rises gradually to $L=\delta_n$, $L=2\delta_n$ and $L=3\delta_n$, the expected crossing rate will fall to 1340, 312 and 25 crossings per second. If $L=4\delta_n$, then on average there will be less than one crossing per second.

Suppose now that the crossing level L has been set at $L=4\delta_n$ and that the crossing rate monitor CRM of FIG. 5 is set to inhibit transmission of significant instants for crossing rates less than 1340 to achieve a very small value of the probability of false outputs. Assume also, for illustrative purposes, that an object-generated signal has the same rectangular spectrum as the background noise. In this case, an output will be provided only if the rms value $\delta_S$ of the signal is approximately at least four times larger than that of the noise.

The use of a high crossing level is also important in both the embodiments of FIGS. 3(a) and 3(b) for another reason. A high crossing level means that the peak in the crosslation sum will be formed of signal segments representing high amplitude portions of the signal received by the slave device. The relative effects of noise on these high amplitude portions will be smaller than the effects on lower amplitude portions, and therefore an improved signal to noise ratio is achieved. Furthermore, the high amplitude portions are more likely to be associated with steeper signal gradients such as spikes in the received signal, giving rise to a narrower and more accurate peak in the resulting crosslation sum waveform. (For many signals, however, higher crossing levels will reduce the average number of crossings per unit interval and therefore a compromise which avoids excessively high crossing levels should be adopted.)

In the above embodiments, it is assumed that the master device operates on a relatively clean, noise-free signal as compared with the slave device(s). This is clearly true for the embodiment of FIG. 3(a), and may also be true of the embodiment of FIG. 3(b), depending on the physical arrangement of the embodiment.

However, there may be applications of the embodiment of FIG. 3(b) where the strongest signal could occur at any of the various places where the different devices are located. It is desirable for the master device to receive the strongest signal, because this results in better defined events in the event data, and improves the accuracy of definition of the events. Accordingly, in these circumstances, it is preferred that each location be able to act selectively as either a master device (as shown in FIG. 5) or a slave device (as shown in FIG. 6), depending on the relative strengths of the signals received at the different locations. Each location therefore has the structure shown in FIG. 5 as well as the structure shown in FIG. 6 (possibly sharing common components), and each can be selectively controlled to perform one of the respective master/slave functions.

To achieve this, each slave device may also be provided with a level crossing detector LCD and a crossing rate monitor CRM (shown in broken lines in FIG. 6), arranged to supply to an input terminal CRI of communication interface processor CIP a signal representing the rate of level crossings of the signal appearing at the slave device. The output of the monitor CRM of FIG. 5 is also delivered to an input terminal CRI of the communication interface processor CIP, as shown in broken lines. A controlling device, which may be disposed at any suitable location, such as the data collection centre DCC of FIG. 3(b), receives all the signals representing the different crossing rates, and in response thereto periodically instructs the location with the highest crossing rate to act as the master device (as described with reference to FIG. 5) and the rest to act as slave devices (as described with reference to FIG. 6).

An arrangement of this type, incorporating a network of devices which can selectively operate as either master or slave devices, is described in our copending European Patent Application No.03252132.0, filed Apr. 3, 2003.

In the arrangements of FIGS. 5 and 6, the register SIPO could be replaced by an analogue delay line having M taps, each of which provides a time delayed replica of the signal appearing at IP. At any time instant, the signal samples observed at the M taps of the analogue delay line would form jointly a discrete-time representation of a finite segment of the signal propagating along the analogue delay line. Preferably, the relative delay between consecutive taps of the analogue delay line would have a constant value. This arrangement would mean that the level crossing detector would only need a single input connected to the centre-tap.

In time delay measurement applications, mutual crosslation is superior to conventional cross-correlation for the following two main reasons:
1. Computation load: Mutual crosslation does not require multiplications, and the whole function is determined in a parallel manner, thus avoiding a variable delay line.
2. Communication link requirements: When the time delay measurement is obtained by cross-correlating signals received at spatially separated sensors, a high fidelity copy of one of those signals must be sent to a cross-correlator; however, a mutual crosslator will require only a sequence of well-defined significant instants (i.e. an event stream) for its correct operation. For data transmission purposes, significant instants can be conveniently represented by a bipolar binary waveform that asynchronously alternates between its two extreme values at the significant instants.

The difference between the transmitted data formats in these two cases is illustrated by Example 2.

EXAMPLE 2

Assume that a signal being processed has a rectangular frequency spectrum extending from 0 Hz to 2 kHz.

If the signal is sampled only at 4 kHz, and each sample is represented by a 10-bit value, a signal segment of duration of 1 second will be represented by a set of 40,000 bits. This data set will have to be sent, via a suitable communication link, to a cross-correlator for time delay determination.

As seen from Example 1, even for the lowest possible value of level L, i.e. L=0, the number of significant instants which need to be sent during a 1-second interval is equal to 2310. A binary waveform representing those significant instants can be transmitted in a convenient manner by applying a bipolar phase or frequency modulation.

Therefore, mutual crosslation can use a simple modulation scheme in a communication link provided, for example, by a low-cost radio transceiver.

In a modification of the embodiment of FIG. 3(a), there is a further signal path FS between the transmitter TR of the master device MD and the receiver RX of the slave device SD. This additional signal path imparts a negligible signal delay, and may be a physical path from the output of the transmitter TR to the input of the receiver RX (where they are located in proximity to each other, i.e. if a slave device is at the site of the master device) as a result of their physical arrangement, or may alternatively be a connection between the electrical paths to the inputs of the master device MD and the slave device SD, using a wired link or possibly the communications link CL.

Figure 7:
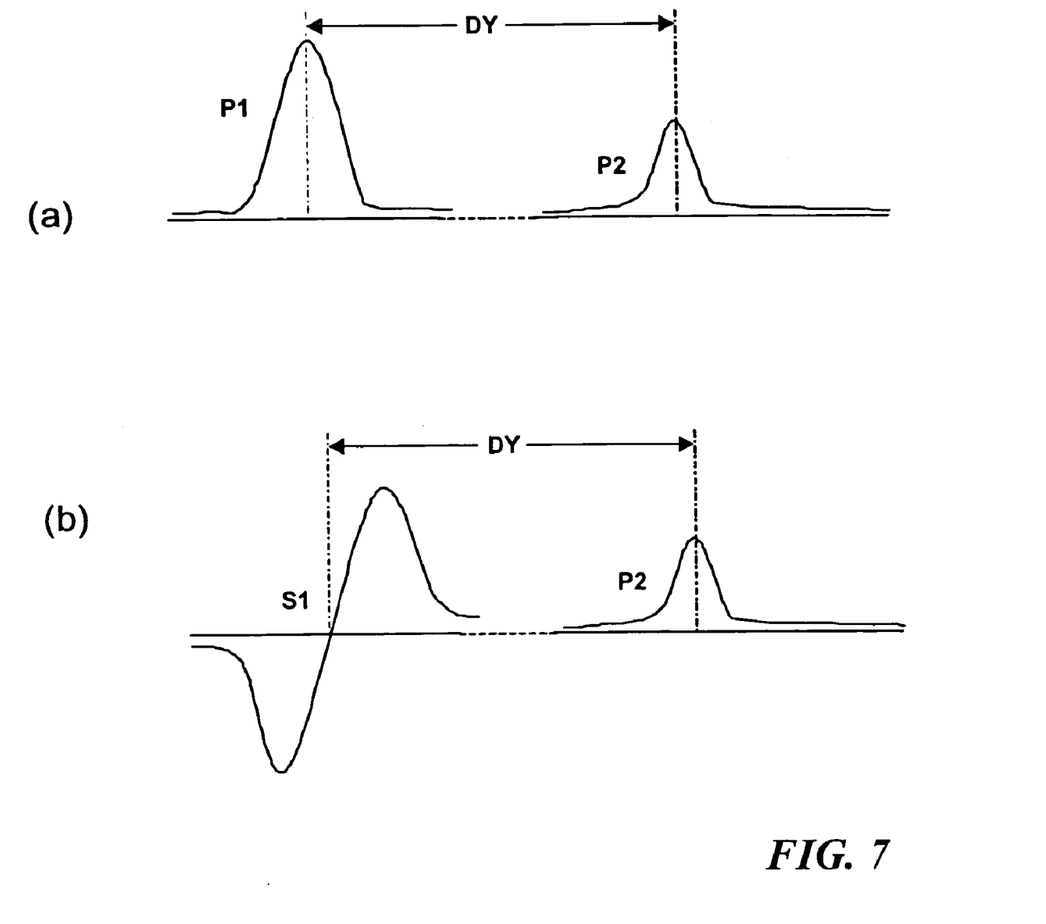

The reason for the additional signal path is to provide enhanced accuracy by precisely defining the point of zero delay, for calibration purposes. Thus, as shown in FIG. 7(a), the crosslation sum signal provided to the waveform analyzer WAN will exhibit two peaks, the position of the maximum of the first peak P1 representing the zero delay point, and the position of the maximum of the second peak P2 corresponding to the delay to be determined. Accordingly, this delay DY can be calculated simply by determining the time between the two peaks.

In practice, this delay time is likely to be significantly longer than the total delay imparted by the shift register SIPO, so that the peaks P1 and P2 will occur in respective crosslation sum waveforms appearing at different times. If desired, a separate channel can be provided in the slave device for processing the zero-delay signal.

FIG. 7(b) illustrates the waveforms which may occur if the separate channel detects the zero-delay point using the techniques of WO-A-00/39643. In this case, the first peak P1 is replaced by an S-shaped curve S1, with the zero-crossing of the curve representing the zero-delay point. This arrangement has the advantage that tracking of the zero point is facilitated in that variations in one sense will result in a positive signal level and in the opposite sense in a negative signal level.

In the above embodiment, object detection and localisation is achieved by using acoustic waves; this is particularly advantageous, because delays arising in the transmission of data representing signal events are negligible having regard to acoustic frequencies. However, the invention is also applicable to other types of signals.

The proposed system, including its architecture and mode of operation, may be one in which an object of interest is illuminated by a source not collocated with any of the master and slave devices. The illuminating source itself may be an active source used by the system, or it may be a 'source of opportunity', such as a commercial radio or TV transmitter, be it ground-based, airborne or spaceborne.

In the embodiments discussed above, it is assumed that each receiver RX receives its signal via a single unique path. In practice, signals may arrive via multiple paths exhibiting different delays. Normally, it is desirable to take into account only that signal which arrives first, via the shortest path, but there may be some situations where it is desirable to consider other received signals instead or in addition.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The invention claimed is:

1. A time measurement system for measuring the delay between first and second signals, the system comprising event-detection means for providing event data representing the times of upcrossings when the first signal crosses a predetermined level with a positive slope and the times of downcrossings when the first signal crosses said predetermined level with a negative slope, and delay-determining means operable to use the event data to define respective staggered segments of the second signal associated with said upcrossings and downcrossings, to sum said segments and to detect a predetermined feature in said sum, the position of said feature representing the delay between the first and second signals.

2. A system as claimed in claim 1, wherein the predetermined level differs significantly from the average value of the first signal.

3. A system as claimed in claim 1, including a wireless communication link operable to transmit said event data to said delay-determining means.

4. A system as claimed in any preceding claim, wherein said feature is a peak, the extreme value of which has a position representing the delay.

5. A system as claimed in claim 4, including means responsive to the amplitude of said extreme value for providing a signal indicative of the reliability of the measured delay.

6. A object detection system comprising a time measurement system as claimed in one of claims 1–3 for measuring a delay associated with a signal received from an object to enable calculation of the range or bearing of the object.

7. An object detection system as claimed in claim 6, comprising a signal generator for generating said first signal, an interrogating signal transmitter for transmitting an interrogating signal derived from said first signal and a receiver for receiving a reflection of the interrogating signal from an object and for generating said second signal in response thereto.

8. An object detection system as claimed in claim 7, including means defining a substantially zero-delay signal path between the event-detection means and the delay-determining means, to enable detection of a zero-delay point, the delay determining means being operable to calculate said delay from the relative position of said feature and the zero-delay point.

9. An object detection system as claimed in claim 6, including first and second receivers for receiving signals from an object and, in response thereto, generating said first and second signals.

10. A time measurement system for measuring the delay between first and second signals appearing at locations which are remote with respect to each other, comprising a device at each said location and a wireless communication link therebetween, at least a first device being operable to transmit via said link event data representing the times at which predetermined events occur within the first signal, and at least a second device being operable to receive the event data, to use the event data to define respective staggered segments of the second signal, to combine said segments and to detect a predetermined feature in said combination, the position of said feature representing the delay between the first and second signals.

11. A method of measuring the shift between first and second signals, the method comprising determining the events at which the first signal level rises above and falls below a predetermined threshold level which differs significantly from the average value of the first signal, combining segments of the second signal which are staggered by the intervals between said events, and detecting the position within the combination of a peak value, said position representing said shift.

* * * * *